United States Patent
Omuro et al.

(10) Patent No.: US 12,444,631 B2
(45) Date of Patent: Oct. 14, 2025

(54) SUBSTRATE SUPPORT DEVICE

(71) Applicant: KELK Ltd., Hiratsuka (JP)

(72) Inventors: Wataru Omuro, Hiratsuka (JP); Atsushi Kobayashi, Hiratsuka (JP)

(73) Assignee: KELK Ltd., Hiratsuka (JP)

( * ) Notice: Subject to any disclaimer, the term of this patent is extended or adjusted under 35 U.S.C. 154(b) by 939 days.

(21) Appl. No.: 17/580,836

(22) Filed: Jan. 21, 2022

(65) Prior Publication Data

US 2022/0246459 A1  Aug. 4, 2022

(30) Foreign Application Priority Data

Jan. 29, 2021 (JP) .................. 2021-013315

(51) Int. Cl.
*H01L 21/677* (2006.01)
*H01L 21/67* (2006.01)

(52) U.S. Cl.
CPC .. *H01L 21/67742* (2013.01); *H01L 21/67288* (2013.01)

(58) Field of Classification Search
CPC ......... H01L 21/67742; H01L 21/68735; H01L 21/67288
See application file for complete search history.

(56) References Cited

U.S. PATENT DOCUMENTS

| 2020/0035465 A1 | 1/2020 | Matsumoto |
| 2020/0035466 A1 | 1/2020 | Matsumoto |
| 2021/0035850 A1* | 2/2021 | Shirley ............. H01L 21/67288 |

FOREIGN PATENT DOCUMENTS

| JP | 2013030772 A | * | 2/2013 | ........ H01L 21/67115 |
| JP | 2020-017685 A | | 1/2020 | |
| JP | 2020-017700 A | | 1/2020 | |

* cited by examiner

*Primary Examiner* — Thien S Tran
(74) *Attorney, Agent, or Firm* — Troutman Pepper Locke LLP

(57) ABSTRACT

A substrate support device includes a placement part formed in a plate shape which extends in a horizontal direction and having a placement surface on which a substrate is placed, and a movable part which makes the placement surface conform to the substrate by moving according to a warpage of the substrate placed on the placement surface. The movable part includes an arm part including an expansion and contraction part which expands and contracts in the horizontal direction according to the warpage of the substrate placed on the placement surface, an arm body having a longitudinal direction in a vertical direction in a state in which the substrate is not placed on the placement surface, and an arm connection part which connects a lower end of the arm body to an outer end of the expansion and contraction part in the horizontal direction.

9 Claims, 6 Drawing Sheets

SUBSTRATE SUPPORT DEVICE

CROSS-REFERENCE TO RELATED APPLICATION

Priority is claimed on Japanese Patent Application No. 2021-013315, filed Jan. 29, 2021, the content of which is incorporated herein by reference.

BACKGROUND

Field of the Invention

The present invention relates to a substrate support device.

Description of Related Art

For example, Japanese Unexamined Patent Application, First Publication No. 2020-17700 discloses a device for adjusting a height of a peripheral portion with respect to a central portion of a semiconductor wafer. This device includes a placement part on which the semiconductor wafer is placed, and an adjustment part which adjusts the height of the peripheral portion with respect to the central portion of the semiconductor wafer. The placement part is formed in a disk shape and is concentrically divided into a plurality of regions. The adjustment part includes a variable thickness layer which is disposed at a lower portion of a region which is the peripheral portion of the placement part, and contracts according to temperature so that a thickness thereof changes, a heater which is disposed corresponding to the variable thickness layer, and a control part which controls a temperature of the heater.

On the other hand, Japanese Unexamined Patent Application, First Publication No. 2020-17685 discloses a device including a placement part on which a semiconductor wafer is placed, a support part which has a flow path for a heat transfer medium formed therein and supports the placement part, a variable thickness layer which is provided between the placement part and the support part and of which a thickness changes via expansion or contraction due to a predetermined process, and a control part which controls the thickness of the variable thickness layer by performing a predetermined process.

SUMMARY

However, it is required to be able to appropriately support a semiconductor wafer having warpage as seen in recent semiconductor wafers with a significantly high degree of lamination.

In Japanese Unexamined Patent Application, First Publication No. 2020-17700, since only the height of the peripheral portion with respect to the central portion of the semiconductor wafer is adjusted, there is a possibility that a large gap will be formed between the central portion and the peripheral portion of the semiconductor wafer, and that a semiconductor wafer having warpage will not be capable of being supported appropriately.

In Japanese Unexamined Patent Application, First Publication No. 2020-17685, the placement part moves up and down by controlling the thickness of the variable thickness layer, and when a direction in which the variable thickness layer contracts is determined, a contraction direction and an elevating direction coincide with each other, and thus there is a possibility that a semiconductor wafer with warpage will not be capable of being supported appropriately.

Therefore, an object of the present invention is to provide a substrate support device capable of appropriately supporting a substrate having warpage.

A substrate support device according to one aspect of the present invention includes a placement part formed in a plate shape which extends in a horizontal direction and having a placement surface on which a substrate is placed, and a movable part which makes the placement surface conform to the substrate by moving according to a warpage of the substrate placed on the placement surface, wherein the movable part includes an arm part including an expansion and contraction part which expands and contracts in the horizontal direction according to the warpage of the substrate placed on the placement surface, an arm body having a longitudinal direction in a vertical direction in a state in which the substrate is not placed on the placement surface, and an arm connection part which connects a lower end of the arm body to an outer end of the expansion and contraction part in the horizontal direction, and which is configured to move according to expansion and contraction of the expansion and contraction part, and an upper connection part which is connected to an upper portion of the arm part and causes the placement part to bend according to movement of the arm part.

According to the above-described aspect, it is possible to appropriately support a substrate having a warpage.

DESCRIPTION OF EMBODIMENTS

Hereinafter, embodiments of the present invention will be described with reference to the drawings. In the embodiments, as an example of a substrate support device, a temperature control device for controlling a temperature (a temperature of a locally heated semiconductor wafer) of a semiconductor wafer (a substrate) such that it becomes a target temperature will be described. For example, the semiconductor wafer is formed in a disk shape.

First Embodiment

<Temperature Control Device>

Figure 1:
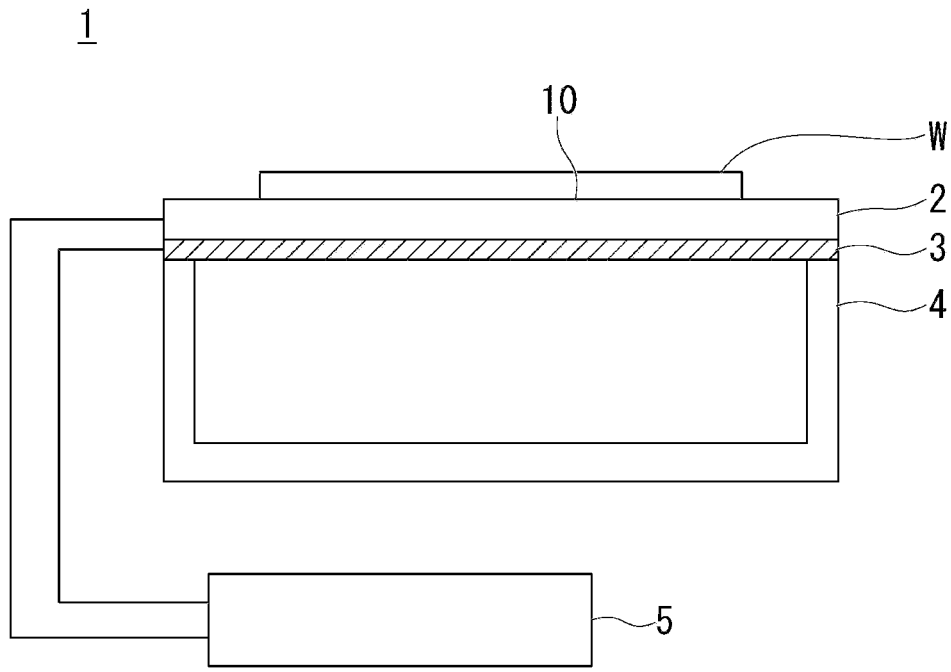
FIG. 1 is a block diagram of a temperature control device according to a first embodiment.
Figure 2:
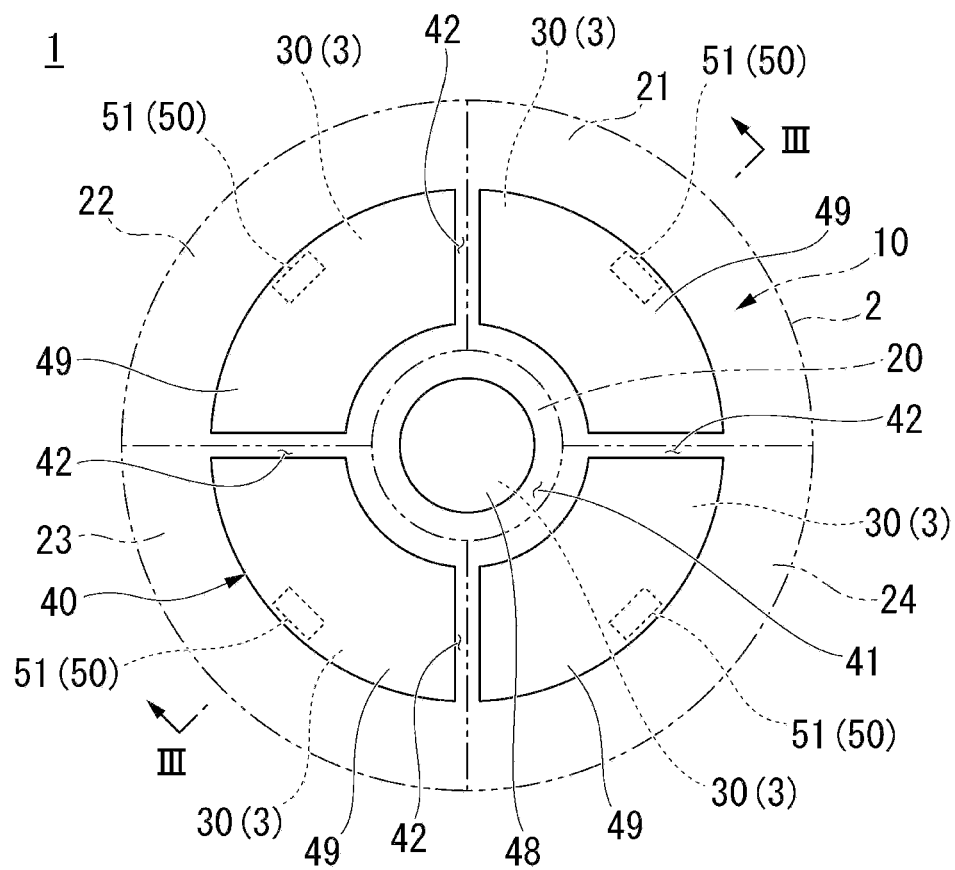
FIG. 2 is a top view of the temperature control device according to the first embodiment through a face plate.
Figure 3:
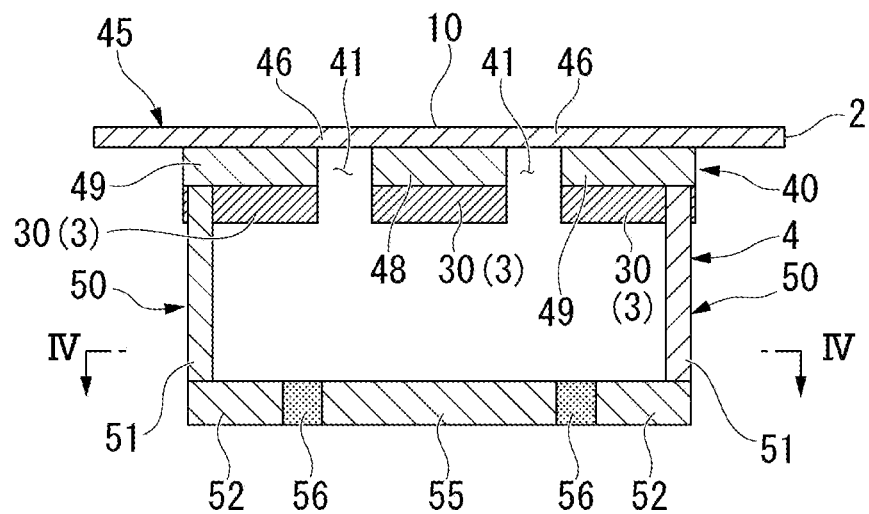
FIG. 3 is a cross-sectional view taken along line III-III of FIG. 2.
Figure 4:
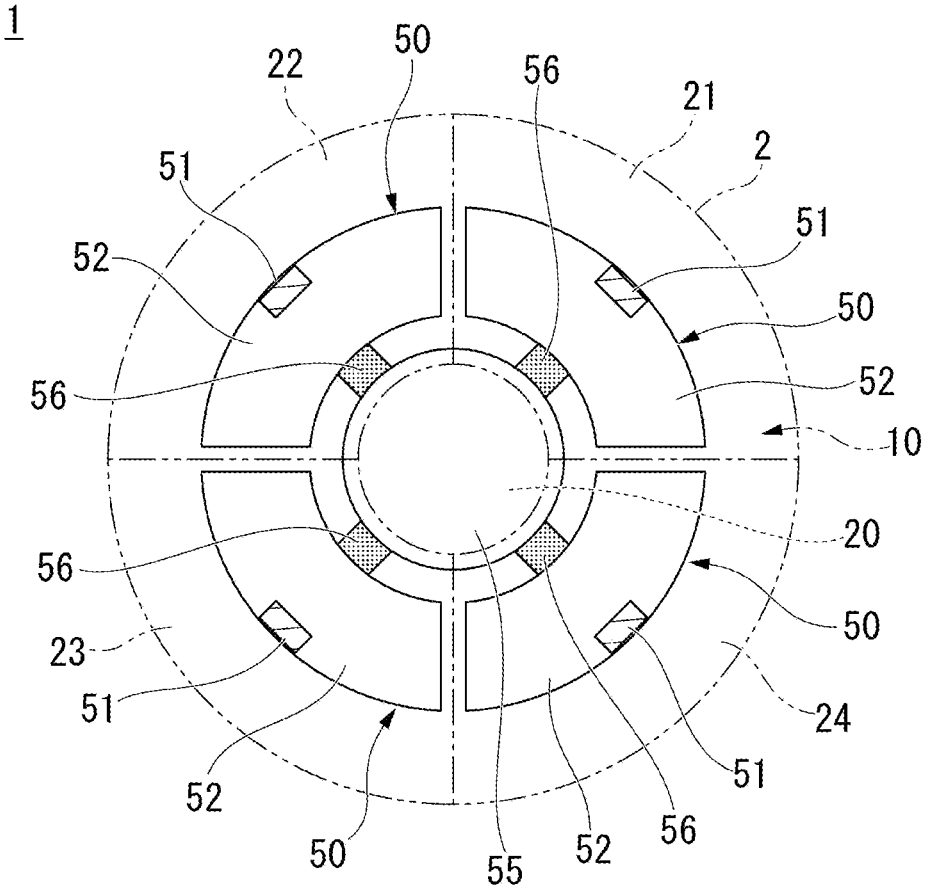
FIG. 4 is a top view including a cross section along line IV-IV of FIG. 3.

FIG. 1 is a block diagram of a temperature control device 1. FIG. 2 is a top view of the temperature control device 1 through a face plate 2. In FIG. 2, an exterior of the face plate 2 and a boundary portion of each of regions 20 to 24 are shown by two-dotted dashed lines. FIG. 3 is a cross-sectional view taken along line III-III of FIG. 2. FIG. 4 is a top view including a cross section along line IV-IV of FIG. 3. In FIG. 4, the exterior of the face plate 2 and the boundary portion (a portion projecting in a plan view) of each of the regions 20 to 24 are shown by two-dotted dashed lines.

As shown in FIG. 1, the temperature control device 1 includes the face plate 2 (a placement part), a temperature adjustment part 3, a movable part 4, and a control part 5. Each of the elements of the temperature control device 1 is controlled by the control part 5.

<Face Plate>

The face plate 2 is formed in a plate shape which extends in a horizontal direction. In the present embodiment, the face plate 2 is formed in a disk shape. The face plate 2 has a placement surface 10 on which a semiconductor wafer W is placed. As shown in FIG. 2, the placement surface 10 is formed in a perfect circular shape (a circular shape) in a plan view. For example, an outer diameter of the placement surface 10 is set to be larger than an outer diameter of the semiconductor wafer W. The placement surface 10 has a plurality of (for example, five in the present embodiment) regions 20 to 24 which are partitioned from each other in a plan view.

The plurality of regions 20 to 24 include a central region 20 provided in a center of the placement surface 10 in a plan view, and a plurality of (for example, four in the present embodiment) outer regions 21 to 24 provided outside the central region 20 in a radial direction in a plan view.

The central region 20 is formed in a perfect circular shape (a circular shape) in a plan view. For example, when the semiconductor wafer W is placed on the placement surface 10, the central region 20 overlaps a central portion of the semiconductor wafer W in a plan view.

For example, when the semiconductor wafer W is placed on the placement surface 10, the four outer regions 21 to 24 overlap an outer peripheral portion of the semiconductor wafer W in a plan view. The four outer regions 21 to 24 are partitioned from each other in a circumferential direction. Each of the outer regions 21 to 24 is formed in a circular arc shape (an arc shape) in a plan view. Each of the outer regions 21 to 24 has a shape in which an annular region surrounding the central region 20 in a plan view is evenly divided into four in the circumferential direction. That is, the four outer regions 21 to 24 have the same shape as each other in a plan view. The four outer regions 21 to 24 are a first outer region 21, a second outer region 22, a third outer region 23, and a fourth outer region 24. The first outer region 21, the second outer region 22, the third outer region 23, and the fourth outer region 24 are disposed in this order in a counterclockwise direction around the central region 20 in a plan view.

<Temperature Adjustment Part>

The temperature adjustment part 3 independently adjusts a temperature of the face plate 2 for each of the plurality of regions 20 to 24. For example, the temperature adjustment part 3 includes a thermoelectric element 30 such as a Peltier element. For example, the thermoelectric element 30 is provided in each of the plurality of regions 20 to 24. For example, when a plurality of thermoelectric elements 30 are energized, each of the regions 20 to 24 can be independently heated and cooled. Each of the thermoelectric elements 30 in each of the regions 20 to 24 is controlled by the control part 5 (refer to FIG. 1).

As shown in FIG. 3, the temperature adjustment part 3 is provided on a lower surface of an upper connection part 40. As shown in FIG. 2, the temperature adjustment part 3 is disposed at a position at which the temperature adjustment part 3 avoids grooves 41 and 42 of the upper connection part 40 in a plan view. In other words, the temperature adjustment part 3 is disposed within a range in which it overlaps each of support parts 48 and 49 of the upper connection part 40 in a plan view.

A cooling part (not shown) such as a water cooling plate for cooling the temperature adjustment part 3 may be provided on a lower surface of the temperature adjustment part 3. For example, the water cooling plate has a cooling passage through which cooling water can flow. For example, the cooling passage may be provided in each of the plurality of regions 20 to 24. For example, each of the regions 20 to 24 can be cooled independently by driving a pump (not shown) and causing cooling water to flow through each of the cooling passages. The pump corresponding to each of the regions 20 to 24 is controlled by the control part 5 (refer to FIG. 1).

Although not shown, a temperature detection part which detects a temperature of the regions 20 to 24 (refer to FIG. 2) of which temperatures have been adjusted by the temperature adjustment part 3 is provided on the face plate 2. For example, the temperature detection part includes a temperature sensor such as a resistance temperature detector (RTD), a thermocouple (TC), or the like. A detection temperature of each of the temperature sensors is input to the control part 5 (refer to FIG. 1).

<Control Part>

The control part 5 controls the temperature adjustment part 3 on the basis of the detection temperature of the temperature sensor. For example, the control part 5 controls the temperature adjustment part 3 in a proportional integral derivative (HD) manner on the basis of the selected detection temperature so that the temperature in a predetermined region (for example, at least one of the plurality of regions 20 to 24) becomes the target temperature.

<Movable Part>

As shown in FIG. 3, the movable part 4 supports the face plate 2 from below. The movable part 4 moves according to the warpage of the semiconductor wafer W placed on the placement surface 10 to make the placement surface 10 conform to the semiconductor wafer W. The movable part 4 includes the upper connection part 40, an arm part 50, a base part 55, and an expansion and contraction part 56. The base part 55 of the constituent elements of the movable part 4 is fixed at a predetermined position (for example, an upper surface of a base (not shown)).

<Upper Connection Part>

The upper connection part 40 is provided on a lower surface of the face plate 2. The upper connection part 40 causes the face plate 2 to bend according to the warpage of the semiconductor wafer W placed on the placement surface 10. The upper connection part 40 is formed in a plate shape along the lower surface of the face plate 2. A thickness (a height in a vertical direction) of the upper connection part 40 is larger than a thickness of the face plate 2. The upper connection part 40 has the grooves 41 and 42 (refer to FIG. 2, only the annular groove 41 is shown in FIG. 3) recessed upward from the lower surface of the upper connection part 40. The upper connection part 40 is divided into a plurality of parts in the horizontal direction by the grooves 41 and 42. The lower surface of the face plate 2 is exposed downward through the grooves 41 and 42. A depth of the grooves 41 and 42 is larger than the thickness of the face plate 2.

The upper connection part 40 is joined to the lower surface of the face plate 2. In a joint body 45 of the face plate 2 and the upper connection part 40, a portion in which the grooves 41 and 42 are provided has lower rigidity than the other portion (a portion in which the grooves 41 and 42 are not provided).

Here, the portion of the joint body 45 in which the grooves 41 and 42 are provided corresponds to a portion of the face plate 2 which overlaps the grooves 41 and 42 in a plan view. The portion of the joint body 45 in which the grooves 41 and 42 are not provided corresponds to a portion of the face plate 2 which does not overlap the grooves 41 and 42 in a plan view (a portion which overlaps each of the support parts 48 and 49 of the upper connection part 40). The joint body 45 has a low-rigidity part 46 having a lower rigidity than the other portion in the portion in which the grooves 41 and 42 are provided. For example, when the semiconductor wafer W having a warpage is placed on the placement surface 10, the face plate 2 is likely to be partially deformed at the low-rigidity part 46. That is, in the joint body 45 of the face plate 2 and the upper connection part 40, the low-rigidity part 46 bends, but the other portion (a portion in which the face plate 2 is in contact with the upper connection part 40, that is, a portion other than the grooves 41 and 42) does not bend.

As shown in FIG. 2, the grooves 41 and 42 are disposed between the plurality of regions 20 to 24. The grooves 41 and 42 are disposed at positions at which they overlap a boundary portion of each of the regions 20 to 24 in a plan view.

The upper connection part 40 includes a central support part 48 formed in a circular shape concentric with the placement surface 10 in a plan view, and a plurality of (for example, four in the present embodiment) outer support parts 49 provided corresponding to the plurality of outer regions 21 to 24. The central support part 48 and the plurality of outer support parts 49 are disposed apart from each other in the horizontal direction via the grooves 41 and 42.

The central support part 48 is formed in a perfect circular shape (a circular shape) smaller than the central region 20 in a plan view.

The outer support parts 49 are disposed within a range which overlaps each of the outer regions 21 to 24 in a plan view. The outer support parts 49 are disposed radially inward in each of the outer regions 21 to 24 in a plan view. Each of the outer support parts 49 is formed in a circular arc shape (an arc shape) smaller than each of the outer regions 21 to 24 in a plan view.

The grooves 41 and 42 include an annular groove 41 having a perfect circular ring (annular) shape in a plan view, and a plurality of (for example, four in the present embodiment) outer grooves 42 which extend radially outward from the annular groove 41 in a plan view.

The annular groove 41 is provided between the central region 20 and the plurality of outer regions 21 to 24 in the radial direction. The annular groove 41 is continuous along the outer circumference of the central region 20 in a plan view. The annular groove 41 extends over the entire outer circumference of the central support part 48 in a plan view.

The outer grooves 42 are respectively provided between the plurality of outer regions 21 to 24 in the circumferential direction. Each of the outer grooves 42 extends linearly along two boundary portions adjacent to each other in the circumferential direction among the plurality of outer regions 21 to 24 in a plan view. Each of the outer grooves 42 is provided between two outer support parts 49 adjacent to each other in the circumferential direction in a plan view.

<Arm Part>

As shown in FIG. 3, the arm part 50 extends downward from an outer end side of the face plate 2 in the horizontal direction. In other words, the arm part 50 extends upward from an outer end side of the expansion and contraction part 56 in the horizontal direction. The arm part 50 moves according to expansion and contraction of the expansion and contraction part 56. As shown in FIG. 2, a plurality of (for example, four in the present embodiment) arm parts 50 are provided corresponding to the plurality of outer regions 21 to 24. The arm part 50 is formed in an L shape in the cross-sectional view of FIG. 3. The arm part 50 includes an arm body 51 having a longitudinal direction in a vertical direction in a state in which the semiconductor wafer W is not placed on the placement surface 10 (hereinafter, also referred to as an "initial state"), and an arm connection part 52 which connects a lower end of the arm body 51 to an outer end of the expansion and contraction part 56 in the horizontal direction.

An upper end of the arm body 51 is connected to the lower surface of the face plate 2 via the outer support part 49. As shown in FIG. 2, the upper end of the arm body 51 is connected to a central portion on the outer circumference of the outer support part 49 in the circumferential direction. For example, the arm body 51 has a rectangular cross-sectional shape. The cross-sectional shape of the arm body 51 may be circular. For example, the cross-sectional shape of the arm body 51 may be a circular arc shape (an arc shape) along the outer circumference of the outer support part 49. For example, the cross-sectional shape of the arm body 51 can be changed according to the required specifications.

As shown in FIG. 4, the arm connection part 52 is disposed within a range in which it overlaps each of the outer regions 21 to 24 in a plan view. The arm connection part 52 is formed in a circular arc shape (an arc shape) smaller than each of the outer regions 21 to 24 in a plan view. The arm connection part 52 is disposed within a range in which it overlaps the outer support part 49 (refer to FIG. 2) in a plan view. The arm connection part 52 is formed in a circular arc shape (an arc shape) smaller than the outer support part 49 in a plan view. The arm connection part 52 may be formed in a circular arc shape (an arc shape) larger than the outer support part 49 in a plan view. For example, the shape of the arm connection part 52 in a plan view can be changed according to the required specifications.

<Base Part>

The base part 55 is formed in a cylindrical shape. As shown in FIG. 3, the base part 55 is disposed downward away from the face plate 2 in the vertical direction. For example, a lower surface of the base part 55 is fixed at a predetermined position (for example, an upper surface of the base (not shown)). For example, the base part 55 is formed to have a size equal to or larger than the base (not shown) in a plan view.

As shown in FIG. 4, the base part 55 is disposed at a position at which the base part 55 overlaps the central region 20 in a plan view. The base part 55 is formed in a perfect circular shape (a circular shape) concentric with the placement surface 10 in a plan view. The base part 55 is formed in a circular shape larger than the central support part 48 (refer to FIG. 2) in a plan view. A thickness of the base part 55 is larger than the thickness of the face plate 2. The base part 55 may be formed in a circular shape smaller than the central support part 48 in a plan view. For example, the shape of the base part 55 in a plan view can be changed according to the required specifications.

<Expansion and Contraction Part>

As shown in FIG. 3, the expansion and contraction part 56 is connected to a lower portion of the arm part 50. The expansion and contraction part 56 expands and contracts in the horizontal direction according to the warpage of the semiconductor wafer W placed on the placement surface 10. For example, the expansion and contraction part 56 is an expansion and contraction mechanism for an air cylinder, a piezoelectric element, or the like.

As shown in FIG. 4, the expansion and contraction part 56 is provided between the arm connection parts 52 and the base parts 55 of the plurality of arm parts 50 in the radial direction. An inner end (one end in an expansion and contraction direction) of the expansion and contraction part 56 in the radial direction is connected to a circumferential central portion of a portion on the outer circumference of the base part 55 which faces the arm connection part 52. In the radial direction, an outer end of the expansion and contraction part 56 (the other end in the expansion and contraction direction) is connected to the circumferential central portion on the inner circumference of the arm connection part 52.

<Operation of Movable Part>

Figure 5:
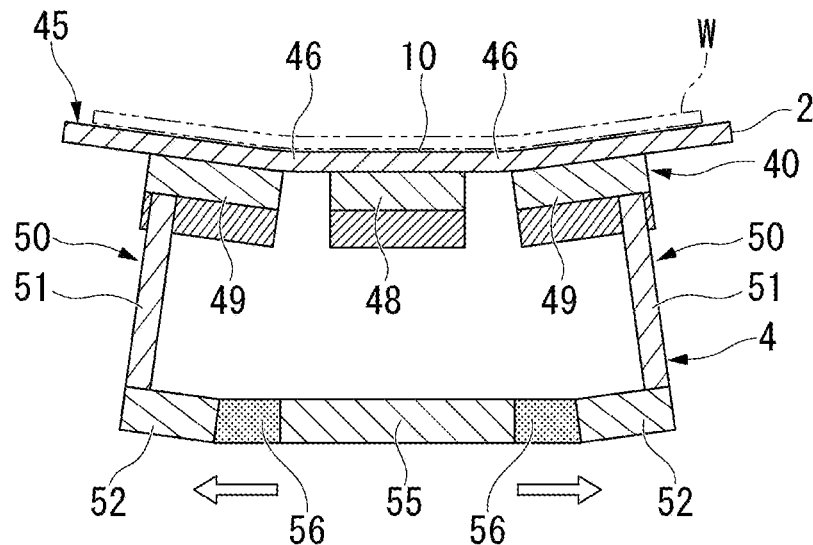
FIG. 5 is a cross-sectional view corresponding to FIG. 3 and shows an example of an operation of a movable part according to the first embodiment.

FIG. 5 is a cross-sectional view corresponding to FIG. 3 and shows an example of an operation of the movable part 4. In FIG. 5, the semiconductor wafer W is shown by a two-dotted dashed line.

As shown in FIG. 5, when the semiconductor wafer W which is curved downward is placed on the placement surface 10, the expansion and contraction part 56 extends in the horizontal direction according to the warpage of the semiconductor wafer W placed on the placement surface 10. Specifically, the expansion and contraction part 56 extends in the horizontal direction from the initial state (state shown in FIG. 3) by being pulled outward in the radial direction (in a direction of an arrow shown in FIG. 5). Then, each of the arm parts 50 moves outward in the radial direction according to the extension of the expansion and contraction part 56. Specifically, the arm body 51 of each of the arm parts 50 is inclined to be located outward in the radial direction from a state in which it extends in the vertical direction (the state shown in FIG. 3) toward the lower side. Then, the upper connection part 40 causes the face plate 2 to bend downward according to the movement of the arm part 50. At this time, the central support part 48 is displaced downward from an initial position (a position shown in FIG. 3), and the outer support part 49 is inclined to be located downward toward the inner side in the radial direction by partially deforming the low-rigidity part 46 in the joint body 45 of the face plate 2 and the upper connection part 40.

Figure 6:
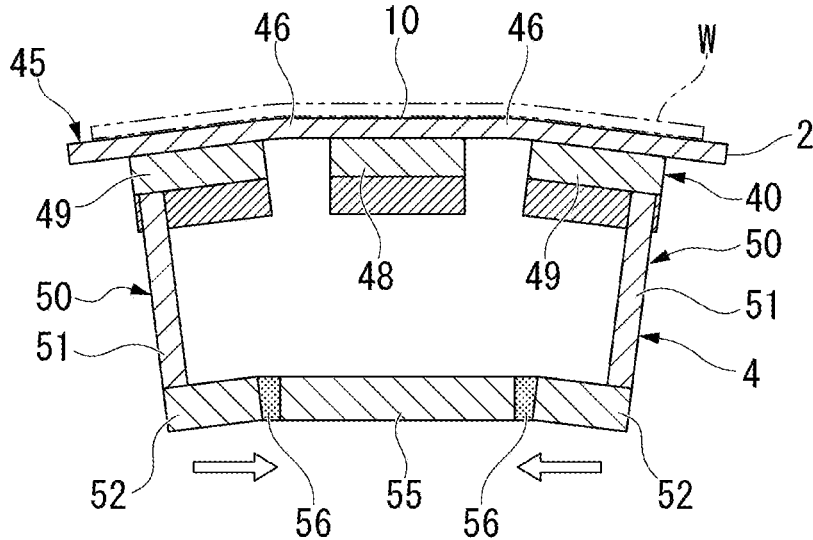
FIG. 6 is a cross-sectional view corresponding to FIG. 3 and shows another example of the operation of the movable part according to the first embodiment.

FIG. 6 is a cross-sectional view corresponding to FIG. 3 and shows another example of the operation of the movable part 4. In FIG. 6, the semiconductor wafer W is shown by a two-dotted dashed line.

As shown in FIG. 6, when the semiconductor wafer W which is curved upward is placed on the placement surface 10, the expansion and contraction part 56 contracts in the horizontal direction according to the warpage of the semiconductor wafer W placed on the placement surface 10. Specifically, the expansion and contraction part 56 contracts in the horizontal direction from the initial state (the state shown in FIG. 3) by being compressed inward in the radial direction (in a direction of an arrow shown in FIG. 6). Then, each of the arm parts 50 moves inward in the radial direction according to the contraction of the expansion and contraction part 56. Specifically, the arm body 51 of each of the arm parts 50 is inclined to be located inward in the radial direction toward the lower side from the state in which it extends in the vertical direction (the state shown in FIG. 3). Then, the upper connection part 40 causes the face plate 2 to bend upward according to the movement of the arm part 50. At this time, the outer support part 49 is inclined to be located downward toward the outer side in the radial direction, and the central support part 48 is displaced upward from the initial position (the position shown in FIG. 3) by partially deforming the low-rigidity part 46 in the joint body 45 of the face plate 2 and the upper connection part 40.

<Effect>

As explained above, the temperature control device 1 according to the present embodiment includes the face plate 2 which is formed in a plate shape extending in the horizontal direction and which has a placement surface 10 on which the semiconductor wafer W is placed, and the movable part 4 which makes the placement surface 10 conform to the semiconductor wafer W by moving according to the warpage of the semiconductor wafer W placed on the placement surface 10. The movable part 4 includes the expansion and contraction part 56 which expands and contracts in the horizontal direction according to the warpage of the semiconductor wafer W placed on the placement surface 10, the arm body 51 having a longitudinal direction in the vertical direction a state in which the semiconductor wafer W is not placed on the placement surface 10, and the arm connection part 52 which connects the lower end of the arm body 51 to the outer end of the expansion and contraction part 56 in the horizontal direction, and includes the arm part 50 which moves according to the expansion and contraction of the expansion and contraction part 56, and the upper connection part 40 which is connected to an upper portion of the arm part 50 and causes the face plate 2 to bend according to the movement of the arm part 50.

With such a constitution, when the semiconductor wafer W having a warpage is placed on the placement surface 10, first, the expansion and contraction part 56 expands and contracts in the horizontal direction, then the arm part 50 moves according to the expansion and contraction of the expansion and contraction part 56, then the upper connection part 40 causes the face plate 2 to bend according to the movement of the arm part 50, and thus the placement surface 10 can be along a lower surface of the semiconductor wafer W. In addition, a vertical displacement of the arm part 50 which moves according to the expansion and contraction of the expansion and contraction part 56 can be made as small as possible by the expansion and contraction part 56 expanding and contracting in the horizontal direction according to the warpage of the semiconductor wafer W placed on the placement surface 10. Thus, when the semiconductor wafer W having a warpage is placed on the placement surface 10, it is possible to curb a locally excessive displacement of the placement surface 10 in the vertical direction, and thus it is possible to curb local generation of a large gap between the lower surface of the semiconductor wafer W and the placement surface 10. Therefore, the semiconductor wafer W having a warpage can be appropriately supported.

Figure 7:
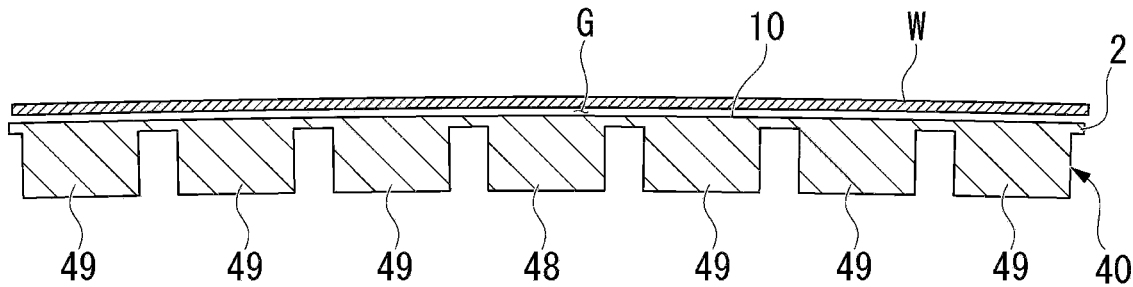
FIG. 7 is a cross-sectional view showing an example of an effect of the movable part according to the first embodiment.
Figure 8:
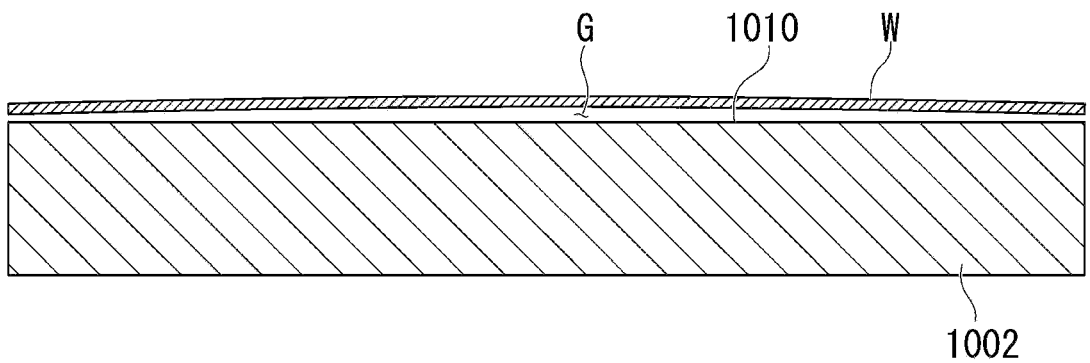
FIG. 8 is a cross-sectional view showing an example of a comparative example.

FIG. 7 is a cross-sectional view showing an example of an effect of the movable part 4 according to the first embodiment. In the example of FIG. 7, the plurality of outer support parts 49 are provided apart from each other in the radial direction via the grooves. FIG. 8 is a cross-sectional view showing an example of a comparative example.

For example, as shown in FIG. 8, when a face plate 1002 is fixed by a support part (not shown), and the semiconductor wafer W having a warpage is placed on a placement surface 1010, a gap G is formed between the lower surface of the semiconductor wafer W and the placement surface 1010. Since a large difference in the gap G occurs between the central portion and the peripheral portion of the semiconductor wafer W, it may not be possible to appropriately support the semiconductor wafer W having a warpage. For example, in order to appropriately support the semiconductor wafer W having a warpage, it is necessary to prepare a face plate dedicated to the semiconductor wafer W having a warpage, and there is a possibility that the types of parts increase and the cost increases. On the other hand, according to the constitution of the present embodiment, as shown in FIG. 7, since the upper connection part 40 causes the face plate 2 to bend according to the warpage of the semiconductor wafer W, even when the gap G is formed between the lower surface of the semiconductor wafer W and the placement surface 10, a size of the gap G becomes substantially the same in the central portion and the peripheral portion of the semiconductor wafer W, and thus the semiconductor wafer W having a warpage can be appropriately supported. In addition, since it is not necessary to prepare the face plate dedicated to the semiconductor wafer W having a warpage, it is possible to curb an increase in the types of parts and to curb an increase in cost.

Further, when only a height of the peripheral portion with respect to the central portion of the semiconductor wafer W is adjusted, there is a possibility that a height adjustment corresponding to a warpage shape in portions other than the peripheral portion of the semiconductor wafer W cannot be performed. On the other hand, according to the constitution of the present embodiment, the upper connection part 40 can adjust the height corresponding to an arbitrary warpage shape of the semiconductor wafer W by causing the face plate 2 to bend according to the warpage of the semiconductor wafer W.

Further, in the present embodiment, the semiconductor wafer W having a warpage (specifically, the semiconductor wafer W having a lower surface at an angle with respect to a horizontal plane) can be appropriately supported by the expansion and contraction part 56 expanding and contracting in the horizontal direction according to the warpage of the semiconductor wafer W, the arm part 50 moving diagonally in the vertical direction according to the expansion and contraction of the expansion and contraction part 56, and the upper connection part 40 causing the face plate 2 to bend according to the movement of the arm part 50.

Further, in the present embodiment, it is possible to correspond to the warpage shape of the semiconductor wafer W with a slight displacement in the vertical direction according to a length of the arm part 50 by the arm part 50 extending upward from the outer end side of the expansion and contraction part 56 in the horizontal direction. For example, it is possible to adjust the height corresponding to an arbitrary warpage shape of the semiconductor wafer W and to accurately support the semiconductor wafer W having a warpage by changing the length of the arm part 50.

In the present embodiment, the upper connection part 40 has the grooves 41 and 42 which are recessed upward from the lower surface of the upper connection part 40.

When the semiconductor wafer W having a warpage is placed on the placement surface 10, the face plate 2 is likely to be partially deformed in the portion in which the grooves 41 and 42 are provided. Therefore, it is possible to correspond to the warpage shape of the semiconductor wafer W with a slight displacement in the vertical direction according to the depth of the grooves 41 and 42. For example, it is possible to adjust the height corresponding to an arbitrary warpage shape of the semiconductor wafer W and to accurately support the semiconductor wafer W having a warpage by changing the depths of the grooves 41 and 42.

For example, when the upper connection part 40 does not have the grooves 41 and 42 and is merely a flat plate, and the semiconductor wafer W having a warpage is placed on the placement surface 10, it may be difficult to cause the placement surface 10 to bend as desired. On the other hand, according to the constitution of the present embodiment, since the upper connection part 40 has the grooves 41 and 42 which are recessed upward from the lower surface of the upper connection part 40, and the grooves 41 and 42 act as guides for places at which the placement surface 10 bends when the semiconductor wafer W having a warpage is placed on the placement surface 10, the placement surface 10 can be bent as desired.

In the present embodiment, the upper connection part 40 is divided into a plurality of parts in the horizontal direction by the grooves 41 and 42. The lower surface of the face plate 2 is exposed downward through the grooves 41 and 42.

Therefore, the portion of the face plate 2 which overlaps the grooves 41 and 42 in a plan view can be formed as the low-rigidity part 46 having a lower rigidity than the other portions, and can be partially easily deformed. On the other hand, the portion of the face plate 2 which does not overlap the grooves 41 and 42 in a plan view has a higher rigidity than the low-rigidity part 46. Thus, when the semiconductor wafer W having a warpage is placed on the placement surface 10, the semiconductor wafer W can be firmly supported in the portion of the face plate 2 which does not overlap the grooves 41 and 42 while the warpage shape of the semiconductor wafer W is followed by the partial deformation of the low-rigidity part 46 of the face plate 2. Therefore, it is possible to achieve both flexible deformation (bending of the face plate 2) according to the warpage of the semiconductor wafer W and stable support of the semiconductor wafer W by the face plate 2.

In the present embodiment, the depths of the grooves 41 and 42 are larger than the thickness of the face plate 2.

Therefore, as compared with the case in which the depths of the grooves 41 and 42 are less than or equal to the thickness of the face plate 2, the face plate 2 is easily bent according to the warpage of the semiconductor wafer W placed on the placement surface 10, and thus it is easy to follow the warpage shape of the semiconductor wafer W.

In the present embodiment, the placement surface 10 has a plurality of regions 20 to 24 partitioned from each other in a plan view. The grooves 41 and 42 are provided between the plurality of regions 20 to 24.

Therefore, the semiconductor wafer W having a warpage can be appropriately supported in each of the plurality of regions 20 to 24.

In the present embodiment, the placement surface 10 has the plurality of regions 20 to 24 partitioned from each other in a plan view. The temperature control device 1 includes the temperature adjustment part 3 which independently adjusts the temperature of the face plate 2 for each of the plurality of regions 20 to 24.

Therefore, the temperature of the semiconductor wafer W can be adjusted for each of the plurality of regions 20 to 24.

For example, when a variable thickness layer is placed at a lower portion of a region which is the peripheral portion of the placement part and expands and contracts to change in thickness according to temperature, and a heater is disposed corresponding to the variable thickness layer, a control part which controls a temperature of the heater is included as a device for adjusting a height of the semiconductor wafer W, and it may not be possible to accurately adjust the temperature of the semiconductor wafer W because of an influence of heating by the heater on the variable thickness layer. On the other hand, according to the constitution of this embodiment, as described above, since the upper connection part 40 causes the face plate 2 to bend according to the warpage of the semiconductor wafer W, and the semiconductor wafer W having the warpage can be appropriately supported, the constitution is not affected by heating by the heater. Therefore, accurate temperature adjustment can be performed on the semiconductor wafer W.

In addition, as described above, even when the gap G is generated as shown in FIG. 7, since a size of the gap G is uniform along the semiconductor wafer W having a warpage by the upper connection part 40 causing the face plate 2 to bend according to the warpage of the semiconductor wafer W, the temperature can be adjusted evenly in the plurality of regions 20 to 24.

In the present embodiment, the temperature adjustment part 3 is provided on the lower surface of the upper connection part 40 and is disposed at a position at which the temperature adjustment part 3 avoids the grooves 41 and 42 in a plan view.

Therefore, the temperature of the semiconductor wafer W can be adjusted for each of the plurality of regions 20 to 24 via the upper connection part 40. In addition, the temperature adjustment part 3 can be disposed so as not to be an obstacle when the upper connection part 40 causes the face plate 2 to bend according to the warpage of the semiconductor wafer W.

In the present embodiment, the placement surface 10 has a circular exterior in a plan view. The plurality of regions 20 to 24 include the central region 20 which is provided in the center of the placement surface 10 in a plan view and is formed in a circular shape in a plan view, and the plurality of outer regions 21 to 24 which are partitioned in the circumferential direction on the side radially outward from the central region 20 in a plan view and are formed in an arc shape in a plan view. The grooves 41 and 42 include the annular groove 41 which is provided between the central region 20 and the plurality of outer regions 21 to 24 in the radial direction and is along the outer circumference of the central region 20 in a plan view, and the plurality of linear outer grooves 42 which are provided in each of spaces between the plurality of outer regions 21 to 24 in the circumferential direction and extend outward from the annular groove 41 in the radial direction in a plan view. The movable part 4 includes the base part 55 disposed at a position at which the base part 55 overlaps the central region 20 in a plan view. A plurality of arm parts 50 are provided corresponding to the plurality of outer regions 21 to 24. The expansion and contraction part 56 is provided between the arm connection part 52 and the base part 55 of each of the plurality of arm parts 50 in the radial direction.

Therefore, when the disk-shaped semiconductor wafer W is placed on the placement surface 10, the semiconductor wafer W having a warpage can be appropriately supported.

Second Embodiment

Figure 9:
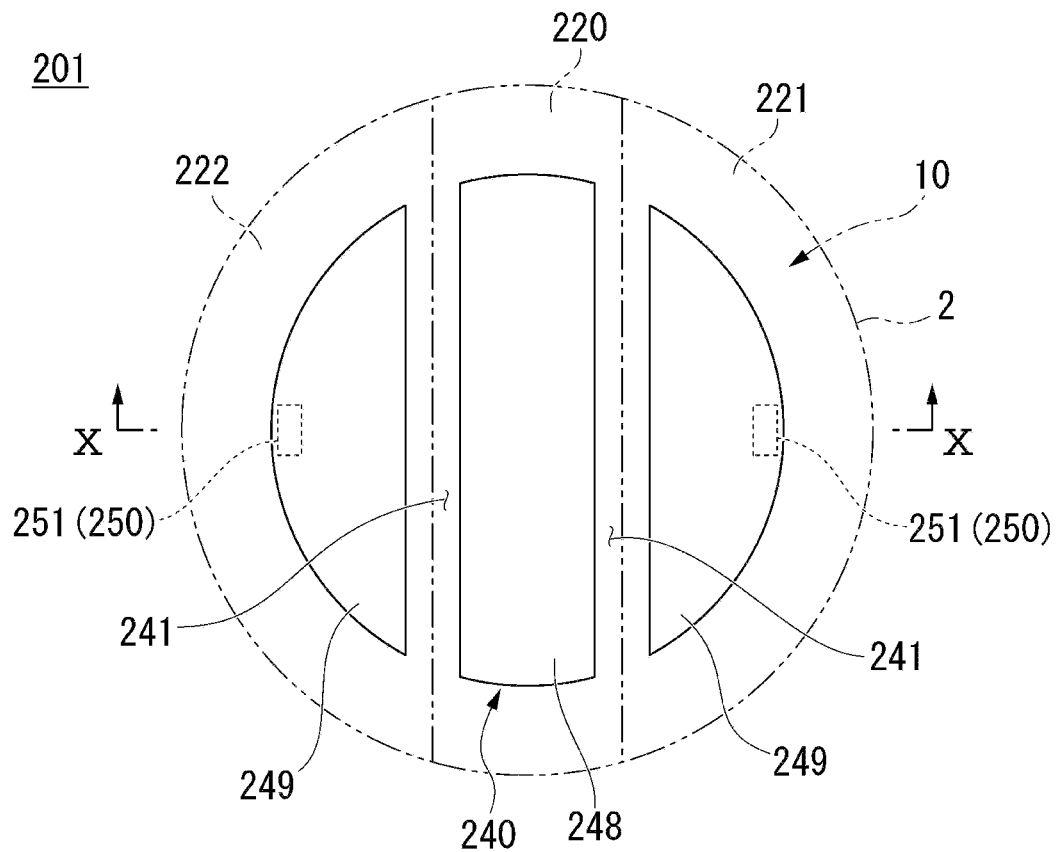
FIG. 9 is a top view of a temperature control device according to a second embodiment through the face plate.

The example (refer to FIG. 2) in which the plurality of regions 20 to 24 include the central region 20 which is provided in the center of the placement surface 10 and is formed in a circular shape in a plan view, and the plurality of outer regions 21 to 24 which are formed in an arc shape and are partitioned from each other in the circumferential direction on the side radially outward from the central region 20 in a plan view has been described in the first embodiment, but the present invention is not limited thereto. As shown in FIG. 9, the second embodiment is different from the first embodiment described above in the aspect of the plurality of regions. In the following description, the same reference numerals will be given to the same constitutions as those in the first embodiment described above, and description thereof will be omitted.

Figure 10:
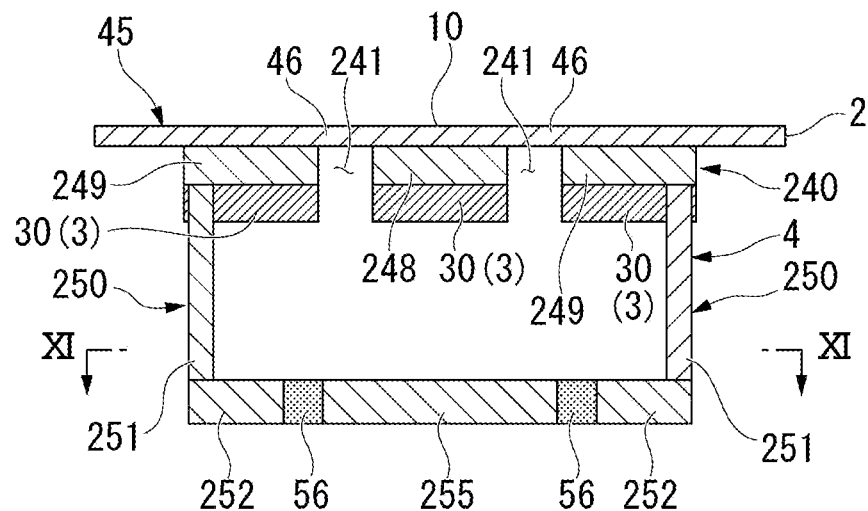
FIG. 10 is a cross-sectional view taken along line X-X of FIG. 9.
Figure 11:
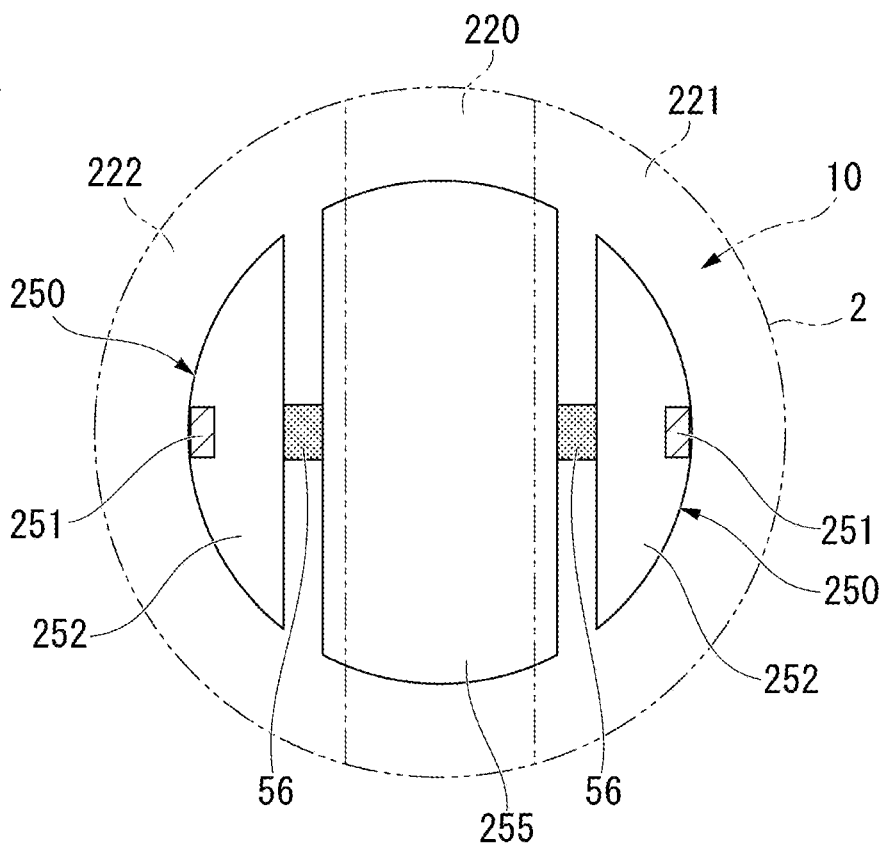
FIG. 11 is a top view including a cross section along line XI-XI of FIG. 10.

FIG. 9 is a top view of a temperature control device 201 through the face plate 2. In FIG. 9, the exterior of the face plate 2 and the boundary portion of each region 220 to 222 are shown by two-dotted dashed lines. FIG. 10 is a cross-sectional view taken along line X-X of FIG. 9. FIG. 11 is a top view including a cross section along line XI-XI of FIG. 10. In FIG. 11, the exterior of the face plate 2 and the boundary portion (the portion projected in a plan view) of each of the regions 220 to 222 are shown by two-dotted dashed lines.

As shown in FIG. 9, the plurality of regions 220 to 222 include a central extension region 220 which passes through the center of the placement surface 10 and extends in the horizontal direction in a plan view, and a plurality of (for example, two in the present embodiment) outer extension regions 221 and 222 which are partitioned from each other on both outer sides of the central extension region 220 in a plan view.

In the central extension region 220, both outer end edges in the longitudinal direction are formed in a circular arc shape (an arc shape) in a plan view.

The outer extension regions 221 and 222 are formed in a semicircular shape which extends along the central extension region 220 in a plan view.

The groove 241 is formed in a straight line which extends along the central extension region 220 in a plan view. A plurality of (for example, two in the present embodiment) grooves 241 (hereinafter, also referred to as "straight grooves 241") are provided. The straight groove 241 is provided between the central extension region 220 and each of the plurality of outer extension regions 221 and 222.

An upper connection part 240 includes a central extension support part 248 which passes through the center of the placement surface 10 and extends in the horizontal direction in a plan view, and a plurality of (for example, two in the present embodiment) outer extension support parts 249 which are provided corresponding to the plurality of outer extension regions 221 and 222.

The central extension support part 248 is disposed within a range in which it overlaps the central extension region 220 in a plan view. The central extension support part 248 is smaller than the central extension region 220 in a plan view.

The outer extension support part 249 is disposed within a range in which it overlaps each of the outer extension regions 221 and 222 in a plan view. The outer extension support part 49 is disposed closer to the inner side (closer to the central extension region 220) in each of the outer extension regions 221 and 222 in a plan view. The outer extension support part 249 is formed in a semicircular shape smaller than each of the outer extension regions 221 and 222 in a plan view.

A plurality of (for example, two in this embodiment) arm parts 250 are provided corresponding to the plurality of outer extension regions 221 and 222. The arm part 250 is formed in an L shape in the cross-sectional view of FIG. 10. Each of the arm parts 250 includes an arm body 251 having a longitudinal direction in the vertical direction in a state in which the semiconductor wafer W is not placed on the placement surface 10 (an initial state), and an arm connection part 252 which connects a lower end of the arm body 251 to an outer end of the expansion and contraction part 56 in the horizontal direction.

An upper end of the arm body 251 is connected to the lower surface of the face plate 2 via the outer extension support part 249. As shown in FIG. 9, the upper end of the arm body 251 is connected to a central portion on the outer circumference of the outer extension support part 249 in the circumferential direction. For example, the arm body 251 has a rectangular cross-sectional shape. The cross-sectional shape of the arm body 251 may be circular. For example, the cross-sectional shape of the arm body 251 may be a circular arc shape (an arc shape) along the outer circumference of the outer extension support part 249. For example, the cross-sectional shape of the arm body 251 can be changed according to the required specifications.

As shown in FIG. 11, the arm connection part 252 is disposed within a range in which it overlaps each of the outer extension regions 221 and 222 in a plan view. The arm connection part 252 is formed in a semicircular shape smaller than each of the outer extension regions 221 and 222 in a plan view. The arm connection part 252 is disposed within a range in which it overlaps the outer extension support part 249 (refer to FIG. 9) in a plan view. The arm connection part 252 is formed in a semicircular shape smaller than the outer extension support part 249 in a plan view. The arm connection part 252 may be formed in a semicircular shape larger than the outer extension support part 249 in a plan view. For example, the shape of the arm connection part 252 in a plan view can be changed according to the required specifications.

As shown in FIG. 11, the base part 255 is disposed at a position at which the base part 255 overlaps the central extension region 220 in a plan view. The base part 255 passes through the center of the placement surface 10 in a plan view and extends in the horizontal direction. In the base part 255, both outer end portions of a short portion of the base part 255 protrude outward with respect to the central extension region 220 in a plan view. The base part 255 is formed in a shape larger than the central extension support part 248 (refer to FIG. 9) in a plan view. The base part 255 may be formed in a shape smaller than the central extension support part 248 in a plan view. For example, the shape of the base part 255 in a plan view can be changed according to the required specifications.

As shown in FIG. 10, the expansion and contraction part 56 is provided between the arm connection part 252 and the base part 255 of each of the plurality of arm parts 250. As shown in FIG. 11, one end (one end in the expansion and contraction direction) of the expansion and contraction part 56 is connected to a central portion of a portion of the base part 255 which faces the arm connection part 252. The other end of the expansion and contraction part 56 (the other end in the expansion and contraction direction) is connected to a central portion of the arm connection part 252 which faces the base part 255.

Figure 12:
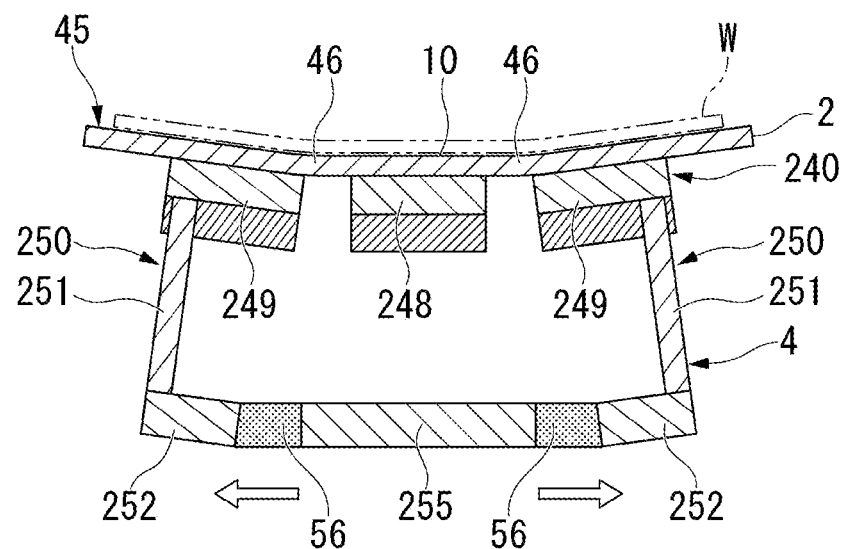
FIG. 12 is a cross-sectional view corresponding to FIG. 10 and shows an example of an operation of a movable part of the second embodiment.

FIG. 12 is a cross-sectional view corresponding to FIG. 10 and shows an example of the operation of the movable part 4. In FIG. 12, the semiconductor wafer W is shown by a two-dotted dashed line.

As shown in FIG. 12, when the semiconductor wafer W which is curved downward is placed on the placement surface 10, the expansion and contraction part 56 extends in the horizontal direction according to the warpage of the semiconductor wafer W placed on the placement surface 10. Specifically, the expansion and contraction part 56 extends in the horizontal direction from the initial state (the state shown in FIG. 10) by being pulled outward in the radial direction (in a direction of an arrow shown in FIG. 12). Then, each of the arm parts 250 moves outward in the radial direction according to the expansion and contraction of the expansion and contraction part 56. Specifically, the arm body 251 of each of the arm parts 250 is inclined to be located outward in the radial direction from a state in which it extends in the vertical direction (a state shown in FIG. 10) toward the lower side. Then, the upper connection part 240 causes the face plate 2 to bend downward according to the movement of the arm part 250. At this time, due to the low-rigidity part 46 being partially deformed in the joint body 45 of the face plate 2 and the upper connection part 240, the central extension support part 248 is displaced downward with respect to an initial position (a position shown in FIG. 10), and the outer extension support part 249 is inclined to be located downward toward the inner side in the radial direction.

Figure 13:
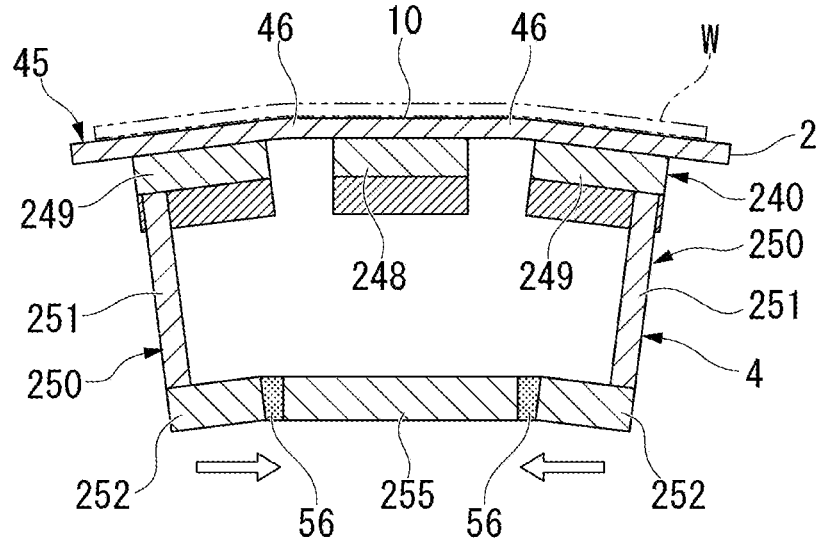
FIG. 13 is a cross-sectional view corresponding to FIG. 10 and shows another example of the operation of the movable part of the second embodiment.

FIG. 13 is a cross-sectional view corresponding to FIG. 10 and shows another example of the operation of the movable part 4. In FIG. 13, the semiconductor wafer W is shown by a two-dotted dashed line.

As shown in FIG. 13, when the semiconductor wafer W which is curved upward is placed on the placement surface 10, the expansion and contraction part 56 contracts in the horizontal direction according to the warpage of the semiconductor wafer W placed on the placement surface 10. Specifically, due to the expansion and contraction part 56 being compressed inward in the radial direction (in a direction of an arrow shown in FIG. 13), the expansion and contraction part 56 contracts in the horizontal direction from the initial state (the state shown in FIG. 10). Then, each of the arm parts 250 moves inward in the radial direction according to the contraction of the expansion and contraction part 56. Specifically, the arm body 251 of each of the arm parts 250 is inclined to be located inward in the radial direction from the state in which it extends in the vertical direction (the state shown in FIG. 10) toward the lower side. Then, the upper connection part 240 causes the face plate 2 to bend upward according to the movement of the arm part 250. At this time, due to the low-rigidity part 46 being partially deformed in the joint body 45 of the face plate 2 and the upper connection part 240, the outer extension support part 249 is inclined to be located downward toward the outer side in the radial direction, and the central extension support part 248 is displaced upward with respect to the initial position (the position shown in FIG. 10).

In the present embodiment, the placement surface 10 has a circular exterior in a plan view. The plurality of regions 220 to 222 include the central extension region 220 which passes through the center of the placement surface 10 and extends in the horizontal direction in a plan view, and the plurality of outer extension regions 221 and 222 which are partitioned from each other on both outer sides of the central extension region 220 in a plan view and extend along the central extension region 220 in a plan view. The groove 241 includes a linear straight groove 241 which is provided between the central extension region 220 and each of the plurality of outer extension regions 221 and 222 and extends along the central extension region 220 in a plan view. The movable part 4 includes a base part 255 disposed at a position at which the base part 255 overlaps the central extension region 220 in a plan view. A plurality of arm parts 250 are provided corresponding to the plurality of outer extension regions 221 and 222. The expansion and contraction part 56 is provided between the arm connection part 252 and the base part 255 of each of the plurality of arm parts 250.

Therefore, when the disk-shaped semiconductor wafer W is placed on the placement surface 10, the semiconductor wafer W having a warpage can be appropriately supported.

Other Embodiments

In the above-described embodiment, the example in which the placement surface is formed in a circular shape in a plan view has been described, but the present invention is not limited thereto. For example, the placement surface may be formed in a rectangular shape in a plan view. For example, the shape of the placement surface in a plan view can be changed according to the required specifications such as the shape of the semiconductor wafer and the like.

In the above-described embodiment, the example in which the upper connection part has a groove which is recessed upward from the lower surface of the upper connection part has been described, but the present invention is not limited thereto. For example, the upper connection part may have a plurality of through holes which open the upper connection part in a thickness direction. For example, the upper connection part may have a low-rigidity part having a lower rigidity than the other portions. For example, the aspect of the low-rigidity part can be changed according to the required specifications.

In the above-described embodiment, the example in which the upper connection part is divided into a plurality of horizontal parts by the groove and the lower surface of the placement part is exposed downward through the groove has been described, but the present invention is not limited thereto. For example, the upper connection part may be continuous in the horizontal direction. For example, the lower surface of the placement part may be covered by the upper connection part. For example, the aspect of the upper connection part can be changed according to the required specifications.

In the above-described embodiment, the example in which the depth of the groove is larger than the thickness of the placement part has been described, but the description is not limited thereto. For example, the depth of the groove may be equal to or smaller than the thickness of the placement part. For example, the depth of the groove may be changed according to the required specifications.

In the above-described embodiment, the example in which the upper connection part causes the placement part to bend has been described, but the present invention is not limited thereto. For example, there may be a constitution in which the placement part is directly connected to the arm part without the upper connection part. For example, a groove may be formed in the placement part so that the placement surface bends.

In the above-described embodiment, the example in which the placement surface has the plurality of regions partitioned from each other in a plan view has been described, but the present invention is not limited thereto. For example, the placement surface may not have the plurality of regions partitioned from each other in a plan view. For example, the aspect of the placement surface can be changed according to the required specifications.

In the above-described embodiment, the example in which the groove is provided between the plurality of regions has been described, but the present invention is not limited thereto. For example, the groove may be provided in a portion other than between the plurality of regions. For example, an installation position of the groove can be changed according to the required specifications.

In the above-described embodiment, the example in which the temperature control device includes the temperature adjustment part which independently adjusts the temperature of the placement part for each of the plurality of regions has been described, but the present invention is not limited thereto. For example, the temperature control device does not have to include the temperature adjustment part which independently adjusts the temperature of the placement part for each of the plurality of regions. For example, the aspect of the temperature control device can be changed according to the required specifications.

In the above-described embodiment, the example in which the temperature adjustment part is provided on the lower surface of the upper connection part and is disposed at a position at which the temperature adjustment part avoids the groove in a plan view has been described, but the present invention is not limited thereto. For example, the temperature adjustment part may be provided at a portion other than the lower surface of the upper connection part. For example, the temperature adjustment part may be built in the upper connection part. For example, the temperature adjustment part may be disposed at a position at which the temperature adjustment part overlaps the groove in a plan view. For example, the aspect of the arrangement of the temperature adjustment part can be changed according to the required specifications.

In the above-described embodiment, as an example of the substrate support device, the temperature control device in which the temperature of the semiconductor wafer (the temperature of the locally heated semiconductor wafer) is controlled to the target temperature has been described, but the present invention is not limited thereto. For example, the substrate support device may be applied to a device other than the device for controlling the temperature of the semiconductor wafer. For example, the substrate support device may be applied to a device for supporting a substrate other than a semiconductor wafer. The usage aspect of the substrate support device can be changed according to the required specifications.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A substrate support device comprising:
   a placement portion formed in a plate shape which extends in a horizontal direction and having a placement surface on which a substrate is placed, the placement portion including a low-rigidity portion having a lower rigidity than a remainder of the placement portion configured to allow the placement portion to partially deform; and a movable portion which makes the placement surface conform to the substrate by moving with to a warpage of the substrate placed on the placement surface, wherein:

the movable portion includes an arm part including, an expansion and contraction section which expands and contracts in the horizontal direction according to the warpage of the substrate placed on the placement surface, an arm having a longitudinal direction in a vertical direction in a state in which the substrate is not placed on the placement surface, and an arm connector which connects a lower end of the arm to an outer end of the expansion and contraction section in the horizontal direction, and configured to move according to expansion and contraction of the expansion and contraction section, and an upper connector which is connected to an upper portion of the arm and causes the placement portion to bend according to movement of the arm.

2. The substrate support device according to claim 1, wherein the upper connector has grooves which are recessed upward from a lower surface of the upper connector.

3. The substrate support device according to claim 2, wherein the upper connector is divided into a plurality of portions by the grooves in the horizontal direction, and a lower surface of the placement portion is exposed downward through the grooves.

4. The substrate support device according to claim 2, wherein a depth of the grooves is larger than a thickness of the placement portion.

5. The substrate support device according to claim 2, wherein the placement surface has a plurality of regions partitioned from each other in a plan view, and the grooves are provided between the plurality of regions.

6. The substrate support device according to claim 1, wherein the placement surface has a plurality of regions partitioned from each other in a plan view, and includes a temperature adjuster which independently adjusts a temperature of the placement portion for each of the plurality of regions.

7. The substrate support device according to claim 6, wherein the upper connector has grooves provided between the plurality of regions, and the temperature adjuster is provided on a lower surface of the upper connector and is disposed at a position at which the temperature adjuster avoids the grooves in a plan view.

8. The substrate support device according to claim 7, wherein the placement surface has a circular exterior in a plan view, the plurality of regions include a central region provided at a center of the placement surface in a plan view and formed in a circular shape in a plan view, and a plurality of outer regions which are partitioned from each other in a circumferential direction on a side radially outward from the central region in a plan view and are formed in an arc shape in a plan view, the groove includes an annular groove which is provided between the central region and each of the plurality of outer regions in a radial direction and extends along an outer circumference of the central region in a plan view, and a plurality of linear outer grooves which are provided between the plurality of outer regions in the circumferential direction and extend outward from the annular groove in the radial direction in a plan view, the movable portion further includes a base disposed at a position at which the base overlaps the central region in a plan view, a plurality of arms are provided corresponding to the plurality of outer regions, and the expansion and contraction section is provided between the arm connector of each of the plurality of arms and the base in the radial direction.

9. The substrate support device according to claim 7, wherein the placement surface has a circular exterior in a plan view, the plurality of regions include a central extension region which passes through a center of the placement surface and extends in the horizontal direction in a plan view, and a plurality of outer extension regions which are partitioned from each other on both sides outward from the central extension region in a plan view and extend along the central extension region in a plan view, the groove includes, in a plan view, a linear straight groove provided between the central extension region and each of the plurality of outer extension regions and extends along the central extension region, the movable part portion further includes a base disposed at a position at which the base overlaps the central extension region in a plan view, a plurality of arms are provided corresponding to the plurality of outer extension regions, and the expansion and contraction section is provided between the arm connector of each of the plurality of arms and the base.

* * * * *